United States Patent [19]
Cho

[11] Patent Number: 5,656,555
[45] Date of Patent: Aug. 12, 1997

[54] MODIFIED HYDROGEN SILSESQUIOXANE SPIN-ON GLASS

[75] Inventor: Chih-Chen Cho, Richardson, Tex.

[73] Assignee: Texas Instruments Incorporated, Dallas, Tex.

[21] Appl. No.: 390,181

[22] Filed: Feb. 17, 1995

[51] Int. Cl.$^6$ .................................................. H01L 21/316
[52] U.S. Cl. ........................ 438/760; 427/387; 427/376.2; 427/226; 438/780
[58] Field of Search .................................. 437/235, 238, 437/231; 427/387, 226, 376.2

[56] References Cited

U.S. PATENT DOCUMENTS

| | | | |
|---|---|---|---|
| 4,756,977 | 7/1988 | Haluska et al. | 428/704 |
| 4,847,162 | 7/1989 | Haluska et al. | 428/457 |
| 5,320,868 | 6/1994 | Ballance et al. | 427/228 |
| 5,380,555 | 1/1995 | Mine et al. | 427/226 |
| 5,380,567 | 1/1995 | Haluska | 427/578 |
| 5,387,480 | 2/1995 | Haluska et al. | 428/698 |
| 5,441,765 | 8/1995 | Ballance et al. | 427/228 |
| 5,506,177 | 4/1996 | Kishimoto et al. | 437/231 |

OTHER PUBLICATIONS

Electronic Packaging Materials Science, Low Temperature Ceramic Coatings for Environmental Protection of Integrated Circuits, Grish Chandra, Mat. Res. Soc. Synp. Proc. vol. 203.

Primary Examiner—Charles L. Bowers, Jr.
Assistant Examiner—Matthew Whipple
Attorney, Agent, or Firm—James E. Harris; Richard A. Stoltz; Richard L. Donaldson

[57] ABSTRACT

A modified hydrogen silsesquioxane (HSQ) precursor is disclosed, along with methods for depositing such a precursor on a semiconductor substrate and a semiconductor device having a dielectric thin film deposited from such a precursor. The method comprises coating a semiconductor substrate 10, which typically comprises conductors 12, with a film of a modified HSQ film precursor. The HSQ film precursor comprises a hydrogen silsesquioxane resin and a modifying agent, preferably selected from the group consisting of alkyl alkoxysilanes, fluorinated alkyl alkoxysilanes, and combinations thereof. The method further comprises curing film 14, wherein the inclusion of the modifying agent inhibits oxidation and/or water absorption by the film during and/or after curing. It is believed that the modifying agent modifies film surface 16 to produce this effect. Films produced according to the present invention apparently have repeatable dielectric properties for drying and curing conditions which produced widely varying properties for unmodified films.

15 Claims, 1 Drawing Sheet

MODIFIED HYDROGEN SILSESQUIOXANE SPIN-ON GLASS

FIELD OF THE INVENTION

This invention relates to the formation of dielectric thin films on semiconductor devices, and more particularly to films deposited from materials such as hydrogen silsesquioxane.

BACKGROUND OF THE INVENTION

Microelectronic devices, such as those fabricated on substrates of single-crystal silicon, typically contain one or more intricately patterned levels of conductors which interconnect the miniature circuitry built into a semiconductor device. These levels of conductors are commonly separated by, and covered with, a film of insulating material. Where the insulating material is inserted between two conducting levels, it is known in the art as an interlevel dielectric (ILD). Where the insulating material separates conductors on the same level, it may be called an intermetal dielectric, or it may be considered with the ILD, particularly if formed by the same deposition as the ILD. Where the insulating material is deposited over the topmost level of conductors on a device, it is known in the art as a protective overcoat (PO). In general, both ILD and PO may be classed as dielectric thin films.

Such dielectric thin films may serve many purposes, including: preventing unwanted shorting of neighboring conductors or conducting levels, by acting as a rigid, insulating spacer; preventing corrosion or oxidation of metal conductors, by acting as a barrier to moisture and mobile ions; filling deep, narrow gaps between closely spaced conductors; and planarizing uneven circuit topography so that a level of conductors can then be reliably deposited on a film surface which is relatively flat. A significant limitation is that typically ILD and PO films must be formed at relatively low temperatures to avoid destruction of underlying conductors. Another very important consideration is that such dielectric films should have a low relative dielectric constant k, as compared to silicon dioxide (k=3.9), to lower power consumption, crosstalk, and signal delay for closely spaced conductors.

Films deposited from hydrogen silsesquioxane (HSQ) resins have been found to possess many of the properties desirable for ILD and PO applications. Haluska et at. (U.S. Pat. No. 4,756,977, Jul. 12, 1988) describe a film deposition technique comprising diluting in a solvent a hydrogen silsesquioxane resin, applying this as a coating to a substrate, evaporating the solvent and ceramifying the coating by heating the substrate in air. Others have found that by ceramifying such a coating in the presence of hydrogen gas (Ballance et at., U.S. Pat. No. 5,320,868, Jun. 14, 1994, which is included herein by reference) or inert gas (European Patent Application 90311008.8), the dielectric constant of the final film may be lowered and/or stabilized as compared to ceramifying in air. Generally, it has been taught that curing in air produces a predominantly Si-O film, curing in ammonia produces a silicon oxynitride type film, and curing in inert or reducing atmospheres results in films which retain some portion of the Si-H bonding inherent in uncured HSQ.

SUMMARY OF THE INVENTION

The present invention relates to a modified hydrogen silsesquioxane film precursor, methods for forming improved dielectric thin films on semiconductor devices using such a precursor, and improved dielectric films formed on a semiconductor device using such a precursor. One problem with existing HSQ films is their propensity to absorb moisture, which in turn can corrode metal leads, degrade circuit performance, and eventually cause circuit failure. It has also been found that control of dielectric constant for such films can be problematic, as a stable and predictable dielectric constant may be difficult to obtain. It is now believed that the preservation of Si-H bonds may be a key to controlling dielectric constant for such films, and that even slight exposure of an HSQ-derived film to oxidizing conditions may adversely affect its dielectric properties.

A novel solution has now been found which apparently at least partially inhibits water absorption in such films, and which apparently also helps preserve Si-H bonds in an HSQ-derived film exposed to oxidizing conditions, thereby resulting in improved and predictable properties for an HSQ-derived dielectric film. This solution is particularly attractive because of the added difficulty and expense of avoiding incidental oxidation and moisture exposure for such a film. It has now been found that a hydrogen silsesquioxane film precursor which comprises both hydrogen silsesquioxane resin and a modifying agent may be used to construct a low dielectric constant, hydrophobic (i.e. moisture resistant) and oxidation resistant dielectric thin film at low temperatures.

Prior art HSQ deposition techniques teach the use of solvents which preferably evaporate completely from a film during the first stages of drying, leaving a film of HSQ resin. In the present invention, a modifying agent preferably included within the HSQ solvents is believed to react with and modify the surface chemistry of the deposited film. It is also believed that the surface chemistry of open cell or closed cell pores within HSQ-derived films may be affected by the modifying agent. Because the modifying agent may be included within the film precursor, an unusual advantage of the present invention may be that a modified surface chemistry apparently exists for all stages of film drying and curing.

In one aspect of the present invention, a method of forming a thin film dielectric on a semiconductor substrate is disclosed. The method comprises coating the substrate with a film of a modified HSQ film precursor, which comprises a hydrogen silsesquioxane resin and a modifying agent in a predetermined volume ratio, and curing the film, preferably in a substantially non-oxidizing atmosphere at a temperature of between 200° C. and 450° C. for a predetermined time.

The predetermined volume ratio of HSQ resin to modifying agent preferably has a value between 40:1 and 2:8. The modifying agent is preferably selected from the group consisting of alkyl alkoxysilanes, fluorinated alkyl alkoxysilanes, and combinations thereof (and is more preferably methyl trimethoxysilane). The modified HSQ film precursor may further comprise other, non-modifying solvents, such as alcohols, benzene, toluene, alkanes, ketones, cyclic dimethylpolysiloxanes, esters or glycol ethers. The method of coating the substrate may, for instance, be spin, spray, dip or flow coating. The substantially non-oxidizing atmosphere is preferably substantially inert (and more preferably an $N_2$ atmosphere comprising less than 1 mole percent oxygen) or reducing (and more preferably a forming gas comprising 10 mole percent $H_2$ and 90 mole percent $N_2$).

In another aspect of the invention, a modified HSQ film precursor suitable for coating a semiconductor substrate is disclosed. This modified HSQ film precursor comprises hydrogen silsesquioxane resin and a modifying agent selected from the group consisting of alkyl alkoxysilanes, fluorinated alkyl alkoxysilanes, and combinations thereof, in a predetermined ratio having a value between 40:1 and 2:8.

In still another aspect of the invention, a semiconductor device is disclosed which comprises a dielectric thin film deposited on a substrate, wherein the dielectric thin film comprises a cured HSQ film having a molar ratio of Si to H of no more than 10:1, and wherein surface groups on the upper surface of the dielectric thin film are principally modifying groups selected from the group consisting of alkyl, fluorocarbon, or fluorinated hydrocarbon groups. In one preferred embodiment, the dielectric thin film is a protective overcoat deposited over a top layer of conductors deposited on the substrate.

BRIEF DESCRIPTION OF THE DRAWINGS

This invention, including various features and advantages thereof, can be best understood by reference to the following drawing, wherein.

DETAILED DESCRIPTION OF THE PREFERRED EMBODIMENTS

Figure 1:
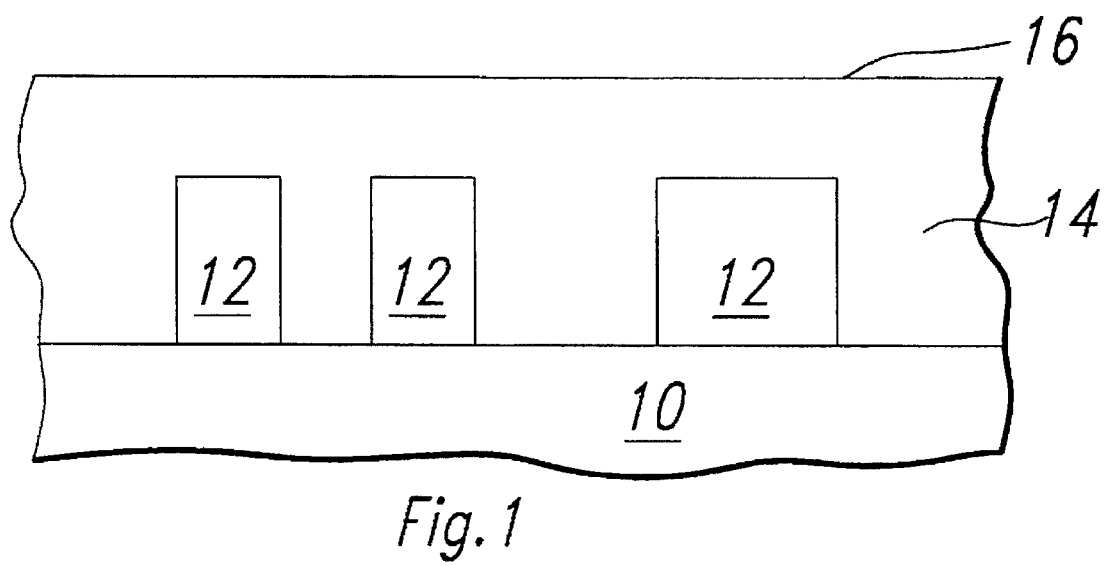
FIG. 1 shows a cured modified HSQ film deposited on a semiconductor substrate.

The present invention provides modified HSQ film precursors suitable for coating a semiconductor substrate, methods for creating and using such precursors to deposit dielectric films of low dielectric constant which resist oxidation and moisture penetration, and dielectric films comprising cured modified HSQ film precursors and deposited on a semiconductor substrate. Modifying agents for such precursors may advantageously be used as an HSQ solvent in a wide range of relative concentrations to adjust film thickness without significant change to the other film properties inherent in films created by the method of the present invention. Alternately, modifying agents may be combined with many other non-modifying solvents, which allows the method to be used with commercially available HSQ precursors.

Hydrogen silsesquioxane resin, as used herein, includes hydridosiloxane resins of the formula $HSi(OH)_x(OR)_yO_{z/2}$, where $x=0-2$, $y=0-2$, $z=1-3$, $x+y+z=3$, and R is an organic group or substituted organic group. Examples of resins included herein are given in the '868 reference, along with methods for producing such resins. One specific preferred example is substantially condensed $(HSiO_{3/2})_n$, where n is an integer indicating the degree of polymerization of the resin and typically ranges from about 10 to about 1000.

HSQ resin may typically be characterized as a white solid which softens and flows at 90° C.–120° C., an advantageous property for forming a planarized dielectric layer. HSQ is marketed commercially by Dow Corning Corporation, Midland, Mich., as the "Dow Corning Flowable Oxide" product line, wherein substantially condensed HSQ resin is combined with the non-modifying solvent methyl isobutyl ketone in various ratios designed to achieve specific desired final film thicknesses. For example, the Dow Corning product "FOx-17" contains 74 weight percent methyl isobutyl ketone and 25 weight percent hydrogen silsesquioxane, and is typically used to deposit films of roughly 5000 to 9000 Å thickness.

Prior applications of HSQ-based dielectric films have taught the importance of using solvents which allow the cured film to be essentially carbon-free. It has now been found that certain modifying agents, which are typically HSQ solvents but do not typically leave the cured film essentially carbon-free, may produce desirable properties in an HSQ-based dielectric film. It is now believed that with such modifying agents, alkyl groups (e.g. $CH_3$), fluorocarbon groups (e.g. $CF_3$) and/or fluorinated hydrocarbon groups (e.g. $CH_2CF_3$) may replace surface groups such as silanol groups in the film structure, resulting in increased hydrophobicity and oxidation resistance for such a film. As demonstrated herein, oxidation of an unmodified HSQ film during or after curing at low temperatures can readily convert most of the film to an Si-O structure typically resembling silicon dioxide, with a dramatic increase in dielectric constant and moisture absorption.

Modifying agents which may be useful in the present invention include alkyl alkoxysilanes, fluorinated alkyl alkoxysilanes, and combinations of these. Preferred examples of such agents include methyl trimethoxysilane (MTEOS), 1,2-bis(trimethoxysilyl)ethane (BTMSE), trimethylchlorosilane, methyltrichlorosilane, and (tri-3,3, 3fluoropropyl)trimethoxysilane. In one preferred embodiment, a modifying agent is used as the solvent for HSQ resin. In a second preferred embodiment, HSQ resin and a modifying agent are combined in a non-modifying solvent in which both are soluble. Suitable non-modifying solvents include alcohols, benzene, toluene, alkanes, ketones, cyclic dimethylpolysiloxanes, esters or glycol ethers. As mentioned, because of commercial availability considerations a preferred non-modifying solvent is methyl isobutyl ketone.

Generally, a modified HSQ film precursor may be prepared from hydrogen silsesquioxane resin directly, or from a HSQ solution containing a non-modifying solvent, such as Dow Corning "FOx-17". In either case, the HSQ or HSQ solution is thoroughly mixed with the modifying agent. After preparation, the HSQ film precursor may be coated on a substrate by, e.g., a spin-on technique. During application to the substrate, the precursor and substrate are typically held at room temperature. Alternately, the substrate and/or precursor supply may be held at a slightly higher temperature, e.g. between 25° C. and 200° C. during coating.

After coating, solvent evaporation and HSQ reflow may be effected by raising the temperature of the substrate to a temperature between 120° C. and 150° C., typically for about 5 minutes. This step may be done in air, or in the curing ambient, at a convenient pressure (typically atmospheric). Alternately, this step may be combined with the following curing step under most curing conditions applicable to an ILD or PO deposition.

Prior art HSQ-derived films have been cured in various ambients, resulting in widely varying properties. These ambients include air, ammonia, nitrogen, nitrogen/argon, and hydrogen/nitrogen. Generally, temperatures of about 400° C. and curing times of about 30 minutes to an hour are also taught in the prior art. In particular, it has been found that curing in air produces a predominantly Si-O film, curing in ammonia produces a silicon oxynitride type film, and curing in inert or reducing atmospheres results in films which retain some portion of the Si-H bonding inherent in uncured HSQ.

Referring to FIG. 1, semiconductor substrate 10 (e.g. of silicon) is shown with conductors 12, which may be, for instance, formed of an aluminum-0.5% copper alloy. The dielectric film of the present invention need not be deposited directly over a conducting layer as shown; i.e. other dielectric layers may intervene or a conducting layer may not be present below the dielectric film of the present invention. In general, dielectric film 14 is deposited by, e.g., spinning a modified HSQ film precursor over substrate 12, followed by solvent drying and film curing steps, which may be combined to convert film 14 to a final form. Either during drying or curing (or between these steps), film 14 is typically subjected to a temperature between 120° C. and 200° C. for a period of time sufficient to produce HSQ resin reflow and enhance the planarization of film 14. In any case, the presence of the modifying agent in the HSQ film precursor is believed to modify surface 16 of film 14 in such a way that oxidation and/or water absorption tendencies of film 14 are reduced.

The present invention is comprehended for use in HSQ films dried and cured in all ambients, including reducing or inert ambients other than those discussed herein. Even films which are carefully cured under non-oxidizing conditions may eventually become exposed to moisture and/or oxygen, either during further processing of the device, during packaging, or in use. As such the present invention creates a more stable barrier to unwanted oxidation and moisture penetration. The invention is also comprehended for use with deposition methods which use trace amounts of a group VIII catalyst, such as $Pt(acac)_2$, to further HSQ film curing. The following examples serve to further illustrate the invention, but should not be construed as limiting the invention.

EXAMPLE 1

"FOx-17", a Dow Corning product containing 74 weight percent methyl isobutyl ketone and 25 weight percent hydrogen silsesquioxane, was supplied. A modified HSQ film precursor was produced by thoroughly mixing 70 volume percent "FOx-17" and 30 volume percent MTEOS. Onto a first 4" n+ silicon wafer, "FOx-17" was spin-coated at room temperature at 3000 rpm for 30 seconds. Onto a second, identical wafer, the modified HSQ film precursor was spin-coated under identical conditions. The wafers were subsequently broken into quarters, with the four quarters from each wafer being dried and cured, respectively, under one of the four following conditions:

1) no drying, cure in 10% $H_2$+90% $N_2$ at 400° C. for 60 minutes;

2) dry in air on a hot plate by ramping from 25° C. to 120° C. in 5 minutes, cure as in 1);

3) dry as in 2), cure in $N_2$ purged box at 400° C. for 60 minutes;

4) dry as in 2), cure in air at 400° C. for 60 minutes.

The drying conditions of 1) were selected as a control for the possible effects of drying in air. Condition 2) provided a reducing curing ambient, condition 3) provided a substantially inert curing ambient, although as much as 1% $O_2$ may be present in the $N_2$ purge gas, and condition 4) provided a clearly oxidizing curing ambient.

Metal-oxide-semiconductor (MOS) capacitive structures were constructed on each of the wafer quarters by depositing Al and patterning Al dots on the cured films. Film thickness was measured using ellipsometry and step height measurement. Capacitance-voltage measurements were made at 1 MHz on each wafer quarter, for MOS capacitors having areas of 0.002 $cm^2$, 0.001 $cm^2$, and 0.0005 $cm^2$.

Ellipsometry studies also showed that for the first wafer quarters cured under conditions 3) and 4), a good fit of phase shift versus wavelength could be obtained using the refractive indices (n) and extinction coefficients (k) of $SiO_2$ at various wavelengths. However, satisfactory fits could not be made for the other samples. It is believed that this is caused primarily by Si-H bonds remaining in the film, although methyl groups contributed by the MTEOS may also contribute to this condition.

A second fit of the ellipsometry data was performed, assuming the existence of a first phase $SiO_2$ component and a second phase (e.g. Si-H) component. This fit was used to calculate the volume percentage of the second phase. Because the n and k for such second phase components were not known, n=1 and k=0, which represent a void, were used with good results. The second phase volume percentage is also tabulated in the results, as a qualitative measure of a second phase component in the films.

As a final test, water contact angle was measured for each wafer quarter, as an indication of film hydrophobicity. These results are summarized in Table 1 below:

TABLE 1

| Film Precursor | Drying/ Curing Method | Dielectric Constant, 1 MHz | 2nd Phase Volume Percentage | Contact Angle, degrees |
| --- | --- | --- | --- | --- |
| FOx-17 | none/reducing | 2.8 | 12.6 | 101 |
| FOx-17 | air/reducing | 2.6 | 10.4 | 102 |
| FOx-17 | air/$N_2$ purge | 5.6 | 0.0 | 58 |
| FOx-17 | air/air | 7.6 | 1.4 | 29 |
| FOx-17/ MTEOS | none/reducing | 3.0 | 12.8 | 100 |
| FOx-17/ MTEOS | air/reducing | 3.0 | 15.6 | 100 |
| FOx-17/ MTEOS | air/$N_2$ purge | 2.9 | 11.6 | 101 |
| FOx-17/ MTEOS | air/air | 6.1 | 5.3 | 33 |

For films with only curing in a reducing ambient, little difference in dielectric constant, second phase volume percentage, and contact angle was found between films made using "FOx-17" as a precursor and films made using MTEOS-modified "FOx-17" as a precursor. Under the same curing conditions but with an air drying step added, the MTEOS-modified film was measured as having about 5% more second-phase component. With air drying and curing in an $N_2$ purge, modifying with MTEOS halved the dielectric constant, added significantly to the second phase component, and markedly increased the hydrophobicity of the final film. Finally, with both drying and curing in air, the MTEOS-modified film appeared to resist oxidation better than the unmodified film, but to a lesser degree than observed for the $N_2$ purge ambient. It is believed that the $N_2$ purge atmosphere contained up to 1% oxygen, resulting in the oxidation of the unmodified film under these conditions. It appears that in general, the amount of oxidation of an HSQ-derived film is related to the time, temperature, and severity of oxidizing ambient that the film is subjected to. For instance, a control study wherein a wafer section was cured for only 30 minutes showed lower dielectric constant and higher second phase component than an identical section cured for 60 minutes. The inclusion of a modifying agent appears to inhibit oxidation, as well as maintain the hydrophobicity of a partially oxidized film. Modified films exposed to some oxidation (e.g. drying/curing conditions 2 and 3) exhibited more predictable and repeatable dielectric constants than their unmodified counterparts.

EXPERIMENT 2

A second experiment was conducted to determine the film properties as a function of modifying agent concentration. In this experiment, different volume percentages of MTEOS were included in a "FOx-17"-derived film precursor, followed by spin-on application to 4" n+silicon wafers at 3000 rpm for 30 seconds at room temperature. Curing conditions for each wafer were 30 minutes at 400° C. in forming gas (10% $H_2$+90% $N_2$). Except for film thickness, film properties were remarkably similar for each film. Film thickness as a function of MTEOS volume percent in the HSQ precursor is presented in Table 2.

TABLE 2

| MTEOS % | 0 | 10 | 20 | 30 | 40 | 50 | 60 | 70 | 100 |
|---|---|---|---|---|---|---|---|---|---|
| Thickness (nm) | 584 | 513 | 463 | 361 | 300 | 199 | 140 | 110 | 0 |

The data in Table 2 suggests that MTEOS acts as a solvent as well as a modifying agent. Note also that 100% MTEOS did not deposit a film. FTIR spectra of the cured MTEOS-modified HSQ films show a definite $CH_3$ peak, indicating the presence of methyl groups from the MTEOS in the film. The exact mechanism by which the modifying agent affects the film structure is not completely understood; however, the evidence tends to support a theory wherein the modifier groups (e.g. methyl) primarily reside on the surface of the film, with little or no internal incorporation into the film. However, it is believed that such modifier groups may also reside on internal surfaces, such as may exist if the film contains open cell or closed cell pores.

What is claimed is:

1. A method of forming a thin film dielectric on a semiconductor substrate, said method comprising:
   (a) coating said substrate with a thin film of a modified HSQ film precursor, wherein said modified HSQ film precursor comprises a hydrogen silsesquioxane resin and a modifying agent selected from the group consisting of alkyl alkoxysilanes, fluorinated alkyl alkoxysilanes, and combinations thereof; and
   (b) curing said thin film at a temperature between 200° C. and 450° C.;
   whereby the inclusion of said modifying agent in said precursor at least partially inhibits oxidation and/or water absorption of said thin film.

2. The method of claim 1, wherein said modified HSQ film precursor comprises a hydrogen silsesquioxane resin and a modifying agent in a volume ratio between 40:1 and 2:8.

3. The method of claim 1, wherein said curing step is performed in an atmosphere comprising less than 1 mole percent oxygen.

4. The method of claim 1, wherein said curing step is performed in a reducing atmosphere.

5. The method of claim 4, wherein said reducing atmosphere is approximately 10 volume percent $H_2$ and 90 volume percent $N_2$.

6. The method of claim 1, further comprising prior to step b), drying said thin film at a temperature of between 25° C. and 120° C. for a period of less than 10 minutes.

7. The method of claim 1, further comprising prior to step b), reflowing said thin film by holding said substrate at a temperature between 120° C. and 200° C. for a period of time sufficient to substantially planarize said thin film.

8. The method of claim 1, wherein said temperature during said curing step is approximately 400° C.

9. The method of claim 1, said curing step having a duration of between approximately 30 minutes and approximately 60 minutes.

10. The method of claim 1, wherein said modifying agent is methyl trimethoxysilane.

11. The method of claim 1, wherein said modified HSQ film precursor further comprises a non-modifying solvent.

12. The method of claim 11, wherein said non-modifying solvent is methyl isobutyl ketone.

13. The method of claim 1, wherein said coating step is performed by a spin-on technique.

14. The method of claim 13, wherein during said coating step, the temperature of said substrate is approximately 25° C.

15. A method of forming a thin film dielectric on a semiconductor substrate, said method comprising:
   (a) supplying a modified HSQ film precursor, said modified HSQ film precursor comprising hydrogen silsesquioxane resin, a non-modifying solvent, and an alkyl alkoxysilane modifying agent;
   (b) spinning said film precursor onto said substrate to form said thin film;
   (c) evaporating said solvent from said thin film; and
   (d) curing said thin film in an atmosphere comprising less than 1 mole percent oxygen at a temperature of between 200° C. and 450° C.;
   whereby the inclusion of said modifying agent in said precursor at least partially inhibits oxidation and/or water absorption of said thin film.

* * * * *